(12) United States Patent
Fukuoka et al.

(10) Patent No.: US 7,959,823 B2
(45) Date of Patent: Jun. 14, 2011

(54) PIEZOELECTRIC CERAMIC COMPOSITION AND PIEZOELECTRIC CERAMIC

(75) Inventors: Shuichi Fukuoka, Kagoshima (JP); Tomonori Eguchi, Kagoshima (JP); Hitoshi Nakakubo, Kagoshima (JP)

(73) Assignee: Kyocera Corporation, Kyoto (JP)

( * ) Notice: Subject to any disclaimer, the term of this patent is extended or adjusted under 35 U.S.C. 154(b) by 614 days.

(21) Appl. No.: 12/091,747

(22) PCT Filed: Oct. 27, 2006

(86) PCT No.: PCT/JP2006/321551
§ 371 (c)(1),
(2), (4) Date: Jun. 10, 2008

(87) PCT Pub. No.: WO2007/049764
PCT Pub. Date: May 3, 2007

(65) Prior Publication Data
US 2009/0267016 A1    Oct. 29, 2009

(30) Foreign Application Priority Data

Oct. 27, 2005  (JP) ................................ 2005-312585

(51) Int. Cl.
*H01L 41/187* (2006.01)
(52) U.S. Cl. .................................. 252/62.9 R; 501/134

(58) Field of Classification Search ............. 252/62.9 R; 501/134
See application file for complete search history.

(56) References Cited

FOREIGN PATENT DOCUMENTS

| JP | 11-228226 A | 8/1999 |
|---|---|---|
| JP | 11-228228 A | 8/1999 |
| JP | 2000-128632 A | 5/2000 |
| JP | 2000-272963 A | 10/2000 |
| JP | 2001-240471 A | 9/2001 |
| JP | 2001-316182 A | 11/2001 |
| JP | 2002-255641 A | 9/2002 |
| JP | 2003-012371 A | 1/2003 |

*Primary Examiner* — C. Melissa Koslow
(74) *Attorney, Agent, or Firm* — Birch, Stewart, Kolasch & Birch, LLP

(57) ABSTRACT

A piezoelectric ceramic composition including potassium-sodium-lithium niobate, bismuth-sodium titanate and bismuth ferrate is provided. A piezoelectric ceramic obtained by firing the piezoelectric ceramic composition, wherein the electromechanical coupling factor is high, the piezoelectric $g_{33}$ constant, in particular, is large, the second phase transformation does not exist in the temperature range of −40 to 150° C. in at least one of a temperature-dependent variation of a resonance frequency, a temperature-dependent variation of an anti-resonance frequency and a temperature-dependent variation of piezoelectric $g_{33}$ constant, and a good heat-resistant property is obtained, is provided.

7 Claims, 4 Drawing Sheets

PIEZOELECTRIC CERAMIC COMPOSITION AND PIEZOELECTRIC CERAMIC

TECHNICAL FIELD

The present invention relates to a piezoelectric ceramic composition and a piezoelectric ceramic, particularly to a piezoelectric ceramic composition and a piezoelectric ceramic useful for piezoelectric ceramics as a resonator such as a piezoelectric sensor, a piezoelectric ceramic filter and a piezoelectric ceramic radiator.

BACKGROUND ART

As a piezoelectric ceramic used for a piezoelectric ceramic element such as a piezoelectric ceramic filter, a piezoelectric ceramic composition including lead zirconate titanate (Pb$(Ti_xZr_{1-x})O_3$) or lead titanate (PbTiO$_3$) as its main component is widely used. In order to realize a high performance of the piezoelectric ceramic whose typical example is a lead zirconate titanate, lead is an indispensable substance to be included.

However, it has been increasingly often pointed out in recent years that lead has harmful effects on a human body. Though a lead component included in lead zirconate titanate which is crystallized is relatively stable in comparison to an applied product including an amorphous lead, there is now a strong public demand that a piezoelectric ceramic in which lead is included by a least possible percentage become available also in terms of the environmental sustainability.

Further, lead oxides are evaporated in the manufacturing process of the piezoelectric ceramic including lead zirconate titanate or lead titanate as its main component. Therefore, there was another problem that variability of the piezoelectric properties was generated among the obtained products.

In order to solve the foregoing problems resulting from the inclusion of the lead component, a novel piezoelectric ceramic free of lead is demanded as a material used for piezoelectric resonators and radiators. Along with the trend, a piezoelectric ceramic of the alkali-niobate series has been attracting attention as a ceramic material showing such high piezoelectric properties without the inclusion of lead.

In the piezoelectric ceramic of the alkali-niobate series, sodium niobate (NaNbO$_3$)(for example, see the Non-Patent Document No. 1) is an oxide whose crystalline structure is of the perovskite type (ABO$_3$). However, the oxide cannot be used as the piezoelectric ceramic because it shows ferroelectricity properties only at a temperature lower than around −133° C. on its own, while failing to show piezoelectric properties in the range of −20 to 80° C. where the materials of piezoelectric resonators and radiators are generally used.

On the other hand, Some piezoelectric ceramics including potassium-sodium-lithium niobate (K$_x$Na$_y$Li$_z$NbO$_3$) as their main component thereof have a large electromechanical coupling factor and appear to be a promising candidate as the material for resonators such as piezoelectric ceramic filters and piezoelectric ceramic radiators (for example, see the Patent Documents No. 1 and No. 2).

Further, as another example of the piezoelectric ceramic not including lead, the piezoelectric ceramic of the bismuth-sodium titanate ((Bi$_{0.5}$Na$_{0.5}$)TiO$_3$) series is known (for example, see Patent Documents No. 2 and No. 3).

[Non-Patent Document No. 1] Japanese Journal of Applied Physics, p. 322, vol. 31, 1992

[Non-Patent Document No. 2] Japanese Journal of Applied Physics, p. 2236, vol. 30, 1991

[Patent Document No. 1] Japanese Unexamined Patent Publication No. H11-228226

[Patent Document 2] Japanese Unexamined Patent Publication No. H11-228228

[Patent Document 3] Japanese Unexamined Patent Publication No. 2000-272963

DISCLOSURE OF THE INVENTION

Figure 1:
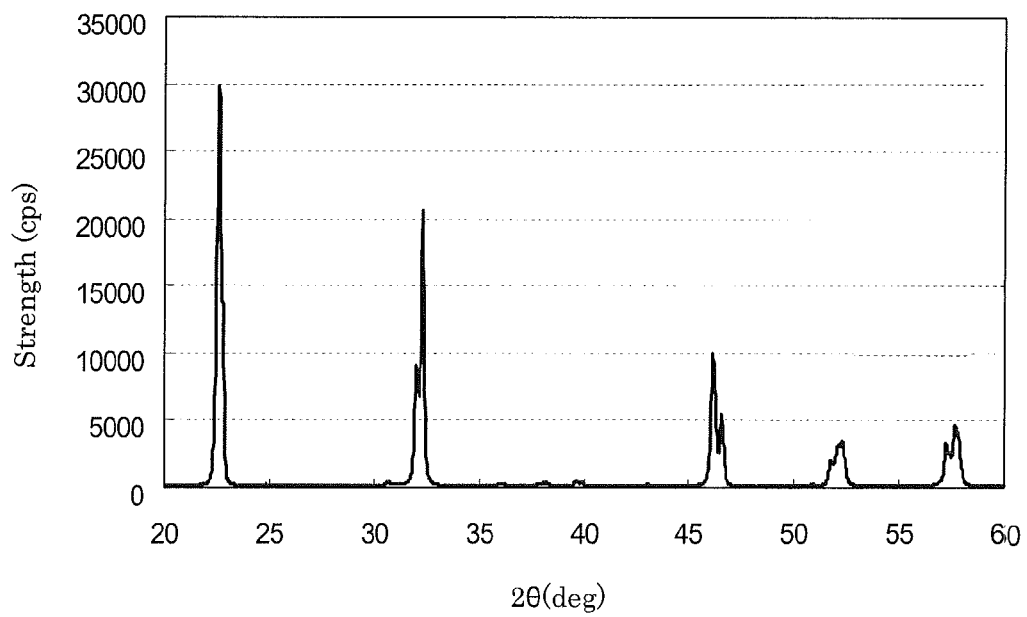
FIG. 1 shows an X-ray diffraction of a sample 1.

Problems to be Solved by the Invention

In the piezoelectric ceramic including potassium-sodium-lithium niobate as the main component thereof, the Curie temperature (first phase transformation) is such a high temperature as approximately 200° C. or more. However, there is a second phase transformation in which the phase transforms from a ferroelectric phase on the low-temperature side to a ferroelectric phase on the high-temperature side in the temperature range of approximately −40 to 150° C. Therefore, in a temperature cycle passing through the second phase transformation, there is a discontinuous part in the variation of the piezoelectric properties and resonance frequency, which unfavorably easily generates significant temperature hysteresis and property degradation. The significant temperature hysteresis and property degradation in the piezoelectric ceramic including potassium-sodium-lithium niobate as the main component thereof are such essential problems that makes it impossible to respond to the reflow in a mounting process, which results in large restrictions on the commercialization of such a product.

Referring to the piezoelectric ceramic of the bismuth-sodium titanate ((Bi$_{0.5}$Na$_{0.5}$)TiO$_3$) series, the Curie temperature (first phase transformation) of the ceramic itself is such a high temperature as approximately 300° C. or more, however, there is the second phase transformation in which the phase transforms from the ferroelectric phase on the low-temperature side to the ferroelectric phase on the high-temperature side at around 200° C. Therefore, when the temperature reaches at least the second phase transformation temperature, the depolarization thereby generated unfavorably made it not possible to respond to the reflow.

In the case where (Bi$_{0.5}$Na$_{0.5}$)TiO$_3$ is singly introduced into potassium-sodium-lithium niobate ((K$_x$Na$_y$Li$_{1-x-y}$)NbO$_3$), the piezoelectric g$_{33}$ constant can be effectively increased while the Curie temperature of 200° C. or more is maintained at the same time, and the second phase transformation exists in the range of −40 to 150° C. Therefore, the temperature range which allows the ceramic to be used is limited, which significantly limits the application range thereof. Accordingly, it was disadvantageously impossible to respond to the replacement of parts of conventionally used piezoelectric sensors or the like.

Further, in the case where $BiFeO_3$ is singly introduced into potassium-sodium-lithium niobate $((K_xNa_yLi_{1-x-y})NbO_3)$, the piezoelectric $g_{33}$ constant can be effectively increased with a slight amount of the $BiFeO_3$. However, the temperatures at which the ceramic is usable are disadvantageously limited because the second phase transformation exists in the range of −20 to 150° C.

Therefore, an object of the present invention is to provide a piezoelectric ceramic composition and a piezoelectric ceramic which includes potassium-sodium-lithium niobate as a main component thereof and which stabilizes piezoelectric properties thereof such as temperature-dependent variation of the resonance frequency, temperature-dependent variation of the anti-resonance frequency and temperature-dependent variation of the piezoelectric $g_{33}$ constant.

Means for Solving the Problems

The inventors of the present invention conducted intensive studies in order to solve the foregoing problems. As a result, they found out that, when bismuth-sodium titanate and bismuth ferrate were introduced into a piezoelectric ceramic composition including potassium-sodium-lithium niobate as a main component thereof, the piezoelectric ceramic composition could have such a particular composition that the composition of potassium-sodium-lithium niobate was Na-rich first, and then, respective oxides such as Bi, Ti and Fe were included, and the piezoelectric properties thereof, such as the temperature-dependent variation of the resonance frequency, temperature-dependent variation of the anti-resonance frequency and temperature-dependent variation of the piezoelectric $g_{33}$ constant, could be thereby stabilized.

More specifically, the composition of (KNaLi) $NbO_3$ that is rich in Na has the crystalline structure of the orthorhombic system, has the second phase transformation in the temperature range of −40 to 150° C., and has the Curie temperature of approximately 200 to 400° C. An appropriate amount of $(Bi_{0.5}Na_{0.5})TiO_3$ in which the crystalline structure has the tetragonal system, the Curie temperature is approximately 340° C., and the second phase transformation in which the phase transforms from the ferroelectric phase on the low-temperature side to the ferroelectric phase on the high-temperature side occurs at around 240° C. is introduced into the (KNaLi)$NbO_3$. In addition, an appropriate amount of $BiFeO_3$ in which the crystalline structure has the rhombohedral system and the Curie temperature is approximately 870° C. is also introduced into the (KNaLi) $NbO_3$. Those introductions make the different crystals compositely dissolved into (KNaLi) $NbO_3$. As a result, the phase transformation temperature is changed so that the temperature-dependent variations of the elastic constant and the piezoelectric $g_{33}$ constant can be controlled.

In one embodiment of the invention, a piezoelectric ceramic composition according to one aspect of the present invention has a composition, $(1-a-b)(K_xNa_yLi_{1-x-y})NbO_3$-$a(Bi_{0.5}Na_{0.5})TiO_3$-$bBiFeO_3$, wherein 0<a≦0.12
0<b≦0.10
0≦x≦0.18
0.8<y<1.00.

Preferably, a piezoelectric ceramic composition has a composition, $(1-a-b)(K_xNa_yLi_{1-x-y})NbO_3$-$a(Bi_{0.5}Na_{0.5})TiO_3$-$bBiFeO_3$, wherein 0.02≦a≦0.04
0.01<b≦0.03
0.025≦x≦0.075
0.905<y<0.98.

A piezoelectric ceramic of the present invention is obtained by firing the piezoelectric ceramic compositions according to the invention.

Advantages

According to one aspect of the present invention, the piezoelectric ceramic composition and the piezoelectric ceramic having stabilized piezoelectric properties such as the temperature-dependent variations of the resonance frequency, anti-resonance frequency and piezoelectric $g_{33}$ constant can be provided. As a result, piezoelectric elements such as piezoelectric ceramic filters and piezoelectric ceramic radiators can be effectively formed from the piezoelectric material not including lead in place of the conventional piezoelectric material including lead.

PREFERRED EMBODIMENTS FOR CARRYING OUT THE INVENTION

As described above, the piezoelectric ceramic composition according to one embodiment of the present invention has the composition including potassium-sodium-lithium niobate, bismuth-sodium titanate, and bismuth ferrate. Provided that the potassium-sodium-lithium niobate is $(K_xNa_yLi_{1-x-y})NbO_3$, the bismuth-sodium titanate is $(Bi_{0.5}Na_{0.5})TiO_3$, and the bismuth ferrate is $BiFeO_3$, the composition preferably has the formula, $(1-a-b)(K_xNa_yLi_{1-x-y})NbO_3$-$a(Bi_{0.5}Na_{0.5})TiO_3$-$bBiFeO_3$, wherein 0<a≦0.12
0<b≦0.10
0≦x≦0.18
0.8<y<1.00.

The compound expressed by the foregoing composition formulas is adjusted through using the respective oxides such as K, Na, Li, Nb, Ti, Bi and Fe included therein, and thereby the piezoelectric ceramic comprising a substantially single phase in which the impurities are hardly seen after the firing can be formed. More specifically, the piezoelectric ceramic composition having the foregoing composition according to one embodiment of the present invention has the specific composition on the Na-rich side in the potassium-sodium-lithium niobate $(K_xNa_yLi_{1-x-y})NbO_3$, while having the crystalline structure of the perovskite type so that $(Bi_{0.5}Na_{0.5})TiO_3$ and $BiFeO_3$ are compositely combined with each other. In other words, the potassium-sodium-lithium niobate, bismuth-sodium titanate, and bismuth ferrate are included so as to have the crystalline structure of the perovskite type in the form of the composite oxides. Accordingly, a piezoelectric ceramic, in which the electromechanical coupling factor is high, the piezoelectric $g_{33}$ constant, in particular, is large, the second phase transformation showing the discontinuous change of the piezoelectric constant is controlled in the temperature range of −40 to 150° C., and the temperature stability of the piezoelectric $g_{33}$ constant and heat resistance are superior, can be formed. More specifically, the piezoelectric ceramic formed from the composition having the specific composition range mentioned above exerts such remarkable piezoelectric properties that the electromechanical coupling factor $k_{33}$ is 30% or more, the piezoelectric $g_{33}$ constant is $20 \times 10^{-3}$ V/N or more, and the second phase transformation does not exist in the temperature range of −40 to 150° C. in at least one of the temperature-dependent variations of the resonance frequency, anti-resonance frequency and piezoelectric $g_{33}$ constant. Further, when the composition is adjusted so that $(Bi_{0.5}Na_{0.5})TiO_3$ and $BiFeO_3$ are compositely dissolved in $(K_xNa_yLi_{1-x-y})NbO_3$ the ceramic can be advantageously more densely formed, which also contributes to the temperature stability of the ceramic.

Figure 4:
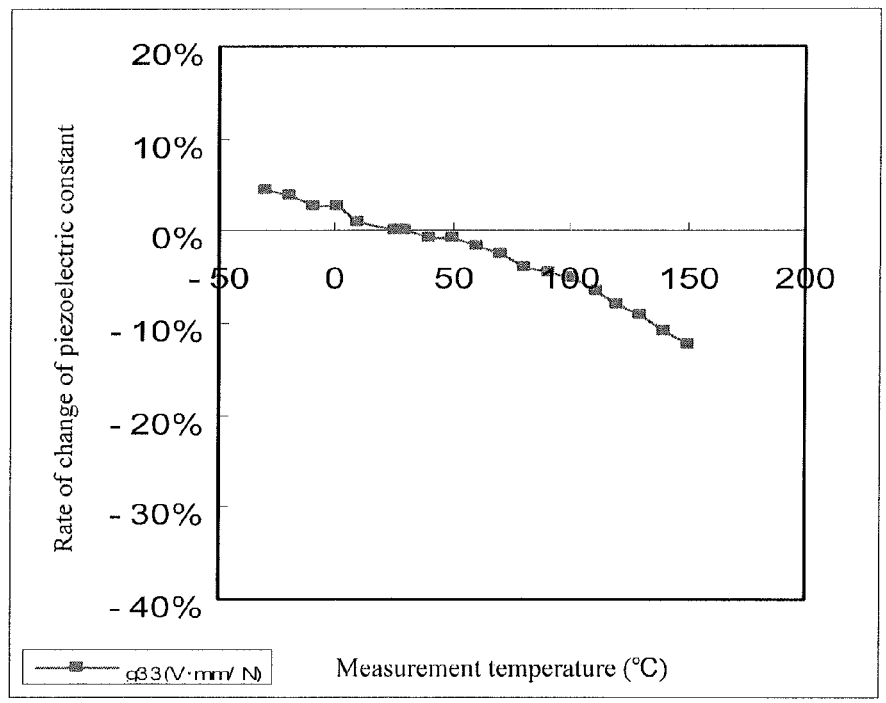
FIG. 4 is a graph showing a temperature-dependent variation of the piezoelectric g$_{33}$ constant of a sample 3.
Figure 5:
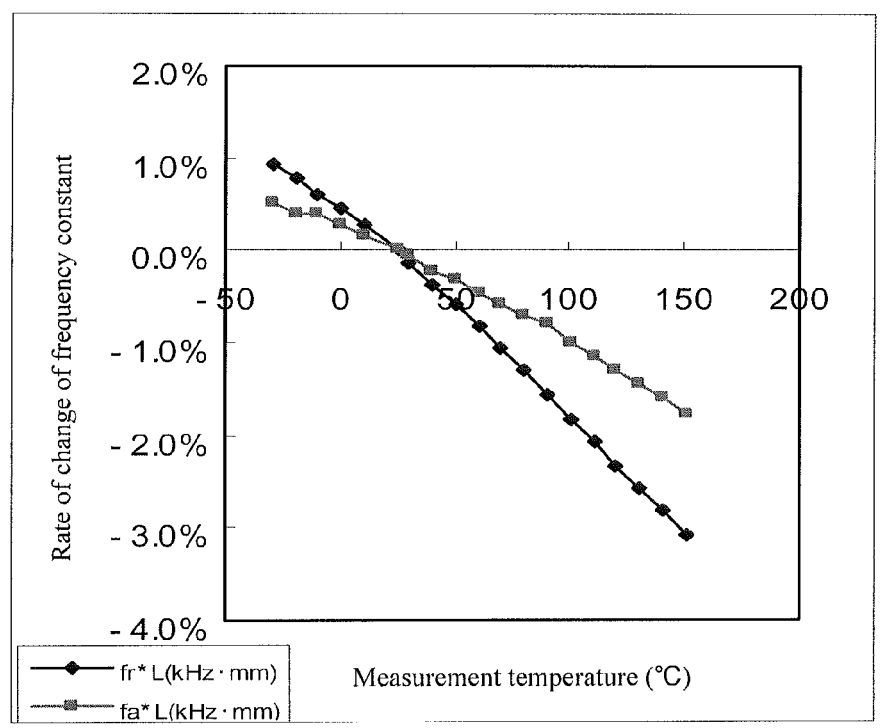
FIG. 5 is a graph showing temperature-dependent variations of resonance and anti-resonance frequencies of the sample 3.
Figure 6:
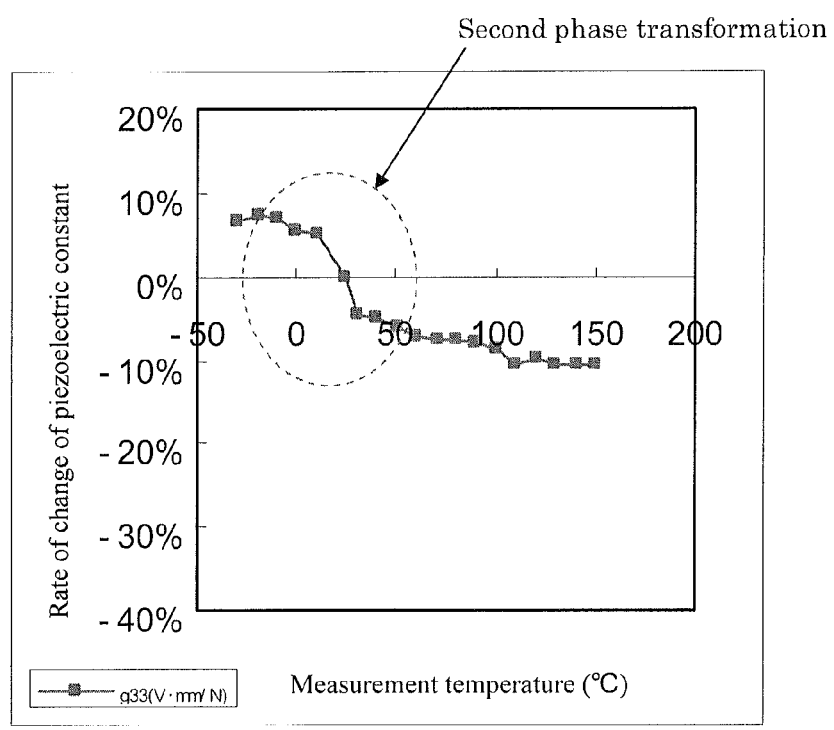
FIG. 6 is a graph showing a temperature-dependent variation of the piezoelectric g$_{33}$ constant of a sample 18.
Figure 7:
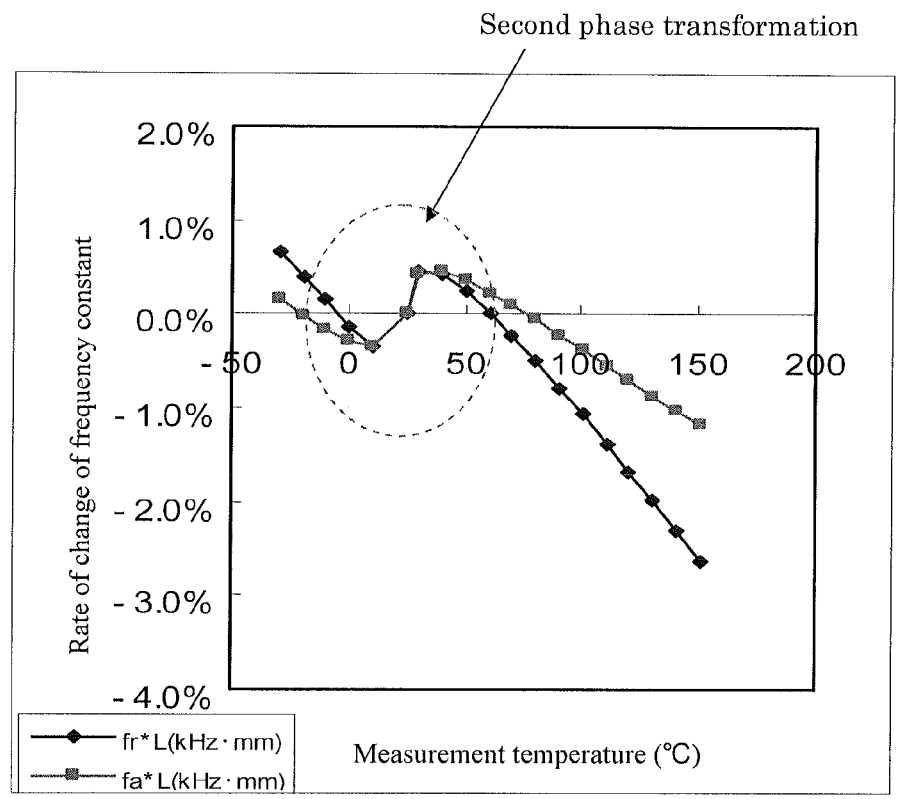
FIG. 7 is a graph showing temperature-dependent variations of resonance and anti-resonance frequencies of the sample 18.

In the present invention, "the second phase transformation does not exist or the second phase transformation substantively does not exist in the temperature range of −40 to 150° C. in at least one of the temperature-dependent variations of the resonance frequency, anti-resonance frequency and piezoelectric $g_{33}$ constant" denotes such apparently linear changes as shown in FIGS. 2 to 5, wherein the change of the piezoelectric constant in each temperature range is small and such drastic changes as shown in FIGS. 6 and 7 are not observed.

In one embodiment of the present invention, as in the composition composed in such a manner as described above, the composition of the bismuth-sodium titanate Bi—Na—Ti—O to be included together with the potassium-sodium-lithium niobate $(K_xNa_yLi_{1-x-y})NbO_3$ is preferably adjusted so as to include 0.5 mole of Bi and Na and 1 mole of Ti in the form of the complex oxide having the $ABO_3$-type perovskite structure in a manner similar to $(Bi_{0.5}Na_{0.5})TiO_3$. For example, in the case where the $ABO_3$-type perovskite structure is not obtained in such a manner that the amounts of Bi, Na and Ti are 1 mole, such a piezoelectric ceramic that does not have the second phase transformation in the temperature range of −40 to 150° C. in at least one of the temperature-dependent variations of the resonance frequency, anti-resonance frequency and piezoelectric $g_{33}$ constant according to one embodiment of the present invention may not be obtained. In such a case, the migration may be easily generated under the DC bias because the excessive composition elements not having the perovskite structure remain in the grain boundary. As a result, the piezoelectric properties may not be shown due to degradation of the insulation property of the ceramic.

In the case where only $(Bi_{0.5}Na_{0.5})TiO_3$ is singly introduced into the potassium-sodium-lithium niobate $(K_xNa_yLi_{1-x-y})NbO_3$, the piezoelectric $g_{33}$ constant can be effectively increased while such a high Curie temperature of 200° C. or more is obtained at the same time. However, the usable temperature range is limited due to the presence of the second phase transformation in the range of −40 to 150° C., which results in quite a limited application range thereof. Therefore, the ceramic cannot be used, for example, for parts of conventionally used piezoelectric sensors and the like. In the case where only the bismuth ferrate $BiFeO_3$ is singly introduced into the potassium-sodium-lithium niobate $(K_xNa_yLi_{1-x-y})NbO_3$, a small amount of the substance to be introduced can effectively increase the piezoelectric $g_{33}$ constant. However, the usable temperatures are unfavorably limited due to the presence of the second phase transformation in the range of −20 to 150° C.

As described, the compositions of $(Bi_{0.5}Na_{0.5})TiO_3$ and $BiFeO_3$ are adjusted so as to have the relationship, $(1-a-b)(K_xNa_yLi_{1-x-y})NbO_3\text{-}a(Bi_{0.5}Na_{0.5})TiO_3\text{-}bBiFeO_3$, wherein $0 < a \leq 0.12$
$0 < b \leq 0.10$
$0 \leq x \leq 0.18$
$0.8 < y < 1.00$.

As a result, a good piezoelectric ceramic in terms of the piezoelectric properties, which can be used in a wider temperature range than in the conventional technology, can be obtained.

Regarding the range of $0 < a \leq 0.12$ in the foregoing formulas, if 'a' exceeded 0.12, the electromechanical coupling factor $k_{33}$ would be smaller than 30%, and the piezoelectric $g_{33}$ constant would less than $20 \times 10^{-3}$V/N, which might make it difficult for the ceramic composition to be used as the material for piezoelectric sensors, piezoelectric ceramic filters, piezoelectric ceramic radiators and the like. If 'a' was 0, the temperature characteristic of the piezoelectric constant might show discontinuous behavior due to the presence of the second phase transformation in the temperature range of −40 to 150° C. Therefore, there is a possibility that the ceramic could not be used in a broad temperature range.

Regarding the range of $0 < b \leq 0.10$ in the foregoing formulas, if 'b' exceeded 0.1 the electromechanical coupling factor $k_{33}$ would be smaller than 30%, which might make it difficult for the ceramic composition to be used as the material for piezoelectric ceramic radiators and the like. If 'b' was 0, the temperature characteristic of the piezoelectric constant might show discontinuous behavior due to the presence of the second phase transformation in the temperature range of −40 to 150° C. Therefore, the ceramic might not be used in a broad temperature range.

Regarding the range of $0 \leq x \leq 0.18$ in the foregoing formulas, if 'x' exceeded 0.18 the electromechanical coupling factor $k_{33}$ would be smaller than 30%, and the piezoelectric $g_{33}$ constant would be less than $20 \times 10^{-3}$V/N, which might make it difficult for the ceramic composition to be used as the material for piezoelectric sensors, piezoelectric ceramic filters, piezoelectric ceramic radiators and the like.

Regarding the range of $0.8 < y < 1.00$ in the foregoing formulas, if 'y' was 0.8 or less, the temperature characteristic of the piezoelectric constant might show a discontinuous behavior due to the presence of the second phase transformation in the temperature range of −40 to 150° C. Therefore, the ceramic might not be possibly used in a broad temperature range. If 'y' was 1, the piezoelectric properties would be significantly deteriorated, and the electromechanical coupling factor $k_{33}$ would be smaller than 30%, and the piezoelectric $g_{33}$ constant would be less than $20 \times 10^{-3}$V/N, which might make it difficult for the ceramic composition to be used as the material of the piezoelectric sensor, piezoelectric ceramic filter, piezoelectric ceramic radiator and the like.

Based on the foregoing reasons, in one embodiment of the present invention, it is preferable that the composition be composed as expressed by the following formula in order that the composition has a Curie temperature of higher than 280° C. at which reflow can be performed, has a electromechanical coupling factor $k_{33}$ of 30% or more, has a piezoelectric $g_{33}$ constant of $20 \times 10^{-3}$V/N or more, and has no existence of the second phase transformation. $(1-a-b)(K_xNa_yLi_{1-x-y})NbO_3\text{-}a(Bi_{0.5}Na_{0.5})TiO_3\text{-}bBiFeO_3$, wherein $0.02 \leq a \leq 0.04$
$0.01 < b \leq 0.03$
$0.025 \leq x \leq 0.075$
$0.905 < y < 0.98$.

The piezoelectric ceramic according to one embodiment of the present invention is obtained by firing the foregoing piezoelectric ceramic composition. The piezoelectric ceramic has such favorable properties that the electromechanical coupling factor $k_{33}$ is 30% or more, the piezoelectric $g_{33}$ constant is $20 \times 10^{-3}$ V/N or more, and a second phase transformation does not exist in the temperature range of −40 to 150° C. in at least one of the temperature-dependent variations of the resonance frequency, anti-resonance frequency and piezoelectric $g_{33}$ constant. Further, the piezoelectric ceramic according to one embodiment of the present invention also shows such a favorable property that the Curie temperature exceeds 200° C. Further, the piezoelectric ceramic according to one embodiment of the present invention includes the potassium-sodium-lithium niobate having the crystalline structure of the perovskite type as the main component thereof, and the second phase transformation substantively does not exist in the temperature range of −40 to 150° C. in at least one of the temperature-dependent variations of the resonance frequency, anti-resonance frequency and piezoelectric $g_{33}$ constant. The piezoelectric ceramic is obtained by firing the piezoelectric ceramic composition described above, and the potassium-sodium-lithium niobate, bismuth-sodium titanate and bismuth ferrate are preferably included so as to have the crystalline structure of the perovskite structure in the form of the composite oxides.

The piezoelectric ceramic according to one embodiment of the present invention is preferably used for the piezoelectric ceramic elements such as piezoelectric ceramic filters and piezoelectric ceramic radiators. Further, the piezoelectric ceramic according to one embodiment of the present invention shows the superior piezoelectric properties as described above, and therefore, can replace the conventional piezoelectric material including lead. The piezoelectric ceramic is particularly suitable for automobile parts, such as a knocking sensor, an acceleration sensor and a shock sensor for an automobile engine.

EXAMPLES

As starting materials, respective powders, which are $K_2CO_3$, $Na_2CO_3$, $Li_2CO_3$, $Bi_2O_3$, $Nb_2O_5$, $TiO_2$, $Fe_2O_3$, were used. The amounts of the respective material powders were weighed so that ceramics having a composition of (1-a-b) $(K_xNa_yLi_{1-x-y})NbO_3$-a $(Bi_{0.5}Na_{0.5})TiO_3$-b$BiFeO_3$ have values for a, b, x and y shown in Table 1. Next, the weighed respective materials were wet-mixed for 12 hours in a ball mill by the use of isopropyl alcohol (IPA) and $ZrO_2$ ball. Next, the mixing result was dried, and then calcined for 3 hours at 900 to 1,000° C. in the atmosphere. The calcining product obtained was finely ground in the ball mill. After that, the ground product was mixed with a binder such as polyvinyl alcohol (PVA) and thereby granulated. Then, the obtained granulating result (powder) was molded in a column shape of 3 mm diameter×12 mm height under the pressure of 200 MPa. The molded material was fired for 2 hours at 1,000 to 1,250° C. in the atmosphere. As a result, a ceramic was obtained.

In order to measure the composition of the obtained ceramic, the obtained ceramic was mixed with boric acid and sodium carbonate and then melted, and the melting result was further dissolved in hydrochloric acid and quantitatively analyzed by ICP emission spectrochemical analysis using a standard sample obtained by diluting a reference solution including 1,000 ppm of the respective elements.

The X-ray diffraction pattern of the obtained ceramic was measured and identified. As a result, it was learned that all the samples included the perovskite-type crystals as a main component thereof (for example, FIG. 1 is a drawing showing the X-ray diffraction of the sample 1). More specifically, it was confirmed that the piezoelectric ceramic according to the present invention had the composite perovskite-type crystalline structure including the three components. However, the ceramic showed the single perovskite crystalline structure, for example, in the view of the X-ray diffraction of the sample 1.

After silver electrodes were formed on both end surfaces having a diameter of 3 mm of the ceramic, a direct current field of 4 to 7 kV/mm was applied thereto for 10 to 30 minutes in the silicon oil at 80° C. to polarize the ceramic. Then, the electrostatic capacitances, resonance/anti-resonance frequencies and resonance resistances of these piezoelectric elements were measured by an impedance analyzer according to the Electronic Materials Manufacturers Association of Japan (EMA). Then, the relative dielectric constant of the longitudinal vibration mode $\in_{33}^T/\in_0$, electromechanical coupling factor $k_{33}$, and the piezoelectric $g_{33}$ constant were obtained from the measured values thus obtained. Further, the temperature dependency (temperature-dependent variation) of the resonance and anti-resonance frequencies and the temperature dependency (temperature-dependent variation) of the piezoelectric $g_{33}$ constant were measured so that the presence or absence of the second phase transformation was evaluated. Temperature-dependent variations of the resonance and anti-resonance frequencies and the piezoelectric $g_{33}$ constant at various temperatures from −40° C. to +150° C. were taken as rates of change based on the value of 25° C. Results are shown in Table 2.

TABLE 1

| Sample No. | BNT *2 a | BF *3 b | K x | Na y |
|---|---|---|---|---|
| 1 | 0.01 | 0.01 | 0.05 | 0.93 |
| 2 | 0.02 | 0.01 | 0.05 | 0.93 |
| 3 | 0.04 | 0.01 | 0.05 | 0.93 |
| 4 | 0.06 | 0.01 | 0.05 | 0.93 |
| 5 | 0.08 | 0.01 | 0.05 | 0.93 |
| 6 | 0.10 | 0.01 | 0.05 | 0.93 |
| 7 | 0.12 | 0.01 | 0.05 | 0.93 |
| *8 | 0.04 | 0.00 | 0.05 | 0.93 |
| *9 | 0.12 | 0.00 | 0.05 | 0.93 |
| 10 | 0.02 | 0.03 | 0.00 | 0.98 |
| 11 | 0.02 | 0.03 | 0.025 | 0.955 |
| 12 | 0.02 | 0.03 | 0.075 | 0.905 |
| 13 | 0.02 | 0.03 | 0.10 | 0.88 |
| 14 | 0.04 | 0.01 | 0.02 | 0.96 |
| 15 | 0.04 | 0.01 | 0.10 | 0.88 |
| 16 | 0.04 | 0.01 | 0.18 | 0.80 |
| 17 | 0.04 | 0.01 | 0.19 | 0.79 |
| *18 | 0.00 | 0.01 | 0.05 | 0.93 |
| *19 | 0.00 | 0.10 | 0.05 | 0.93 |
| 20 | 0.01 | 0.09 | 0.05 | 0.93 |
| *21 | 0.04 | 0.00 | 0.05 | 0.93 |
| 22 | 0.01 | 0.01 | 0.00 | 1.00 |
| 23 | 0.01 | 0.01 | 0.05 | 0.95 |

The sample numbers noted with '*' are not included in the present invention.

*2; $(Bi_{0.5}Na_{0.5})TiO_3$

*3; $BiFeO_3$

TABLE 2

| Sample No. | $k_{33}$ (%) | $g_{33}$ ($\times 10^{-3}$ V/N) | $\epsilon_{33}^T/\epsilon_0$ | Temperature-dependent variation of $g_{33}$ constant** Confirmation of second transformation | Temperature-dependent variations of resonance and anti-resonance frequencies** Confirmation of second transformation |
|---|---|---|---|---|---|
| 1 | 43 | 29 | 193 | o(FIG. 2) | o(FIG. 3) |
| 2 | 43 | 29 | 204 | o | o |
| 3 | 44 | 28 | 229 | o(FIG. 4) | o(FIG. 5) |
| 4 | 44 | 27 | 255 | o | o |
| 5 | 43 | 24 | 318 | o | o |
| 6 | 42 | 21 | 371 | o | o |
| 7 | 40 | 21 | 415 | o | o |
| *8 | 34 | 22 | 221 | x | x |
| *9 | 37 | 21 | 408 | x | x |
| 10 | 43 | 27 | 200 | o | o |
| 11 | 42 | 30 | 189 | o | o |
| 12 | 44 | 32 | 185 | o | o |
| 13 | 30 | 20 | 230 | o | o |
| 14 | 42 | 25 | 235 | o | o |
| 15 | 46 | 28 | 273 | o | o |
| 16 | 32 | 22 | 325 | o | o |
| 17 | 26 | 17 | 334 | o | o |
| *18 | 42 | 31 | 178 | x(FIG. 6) | x(FIG. 7) |
| *19 | 32 | 21 | 235 | x | x |
| 20 | 34 | 23 | 230 | o | o |
| *21 | 34 | 22 | 221 | x | x |
| 22 | 11 | 6 | 163 | o | o |
| 23 | 41 | 30 | 185 | o | o |

The sample numbers noted with * are not included in the present invention.
***'o' means existence of transformation, and 'x' means nonexistence of transformation.

Figure 2:
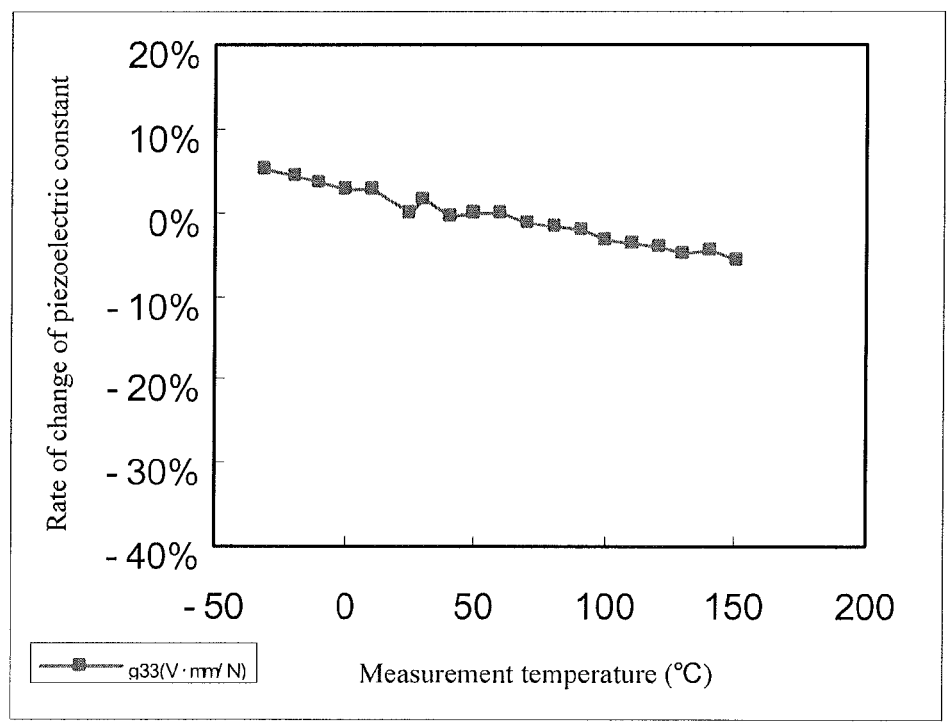
FIG. 2 is a graph showing a temperature-dependent variation of the piezoelectric g$_{33}$ constant of the sample 1.
Figure 3:
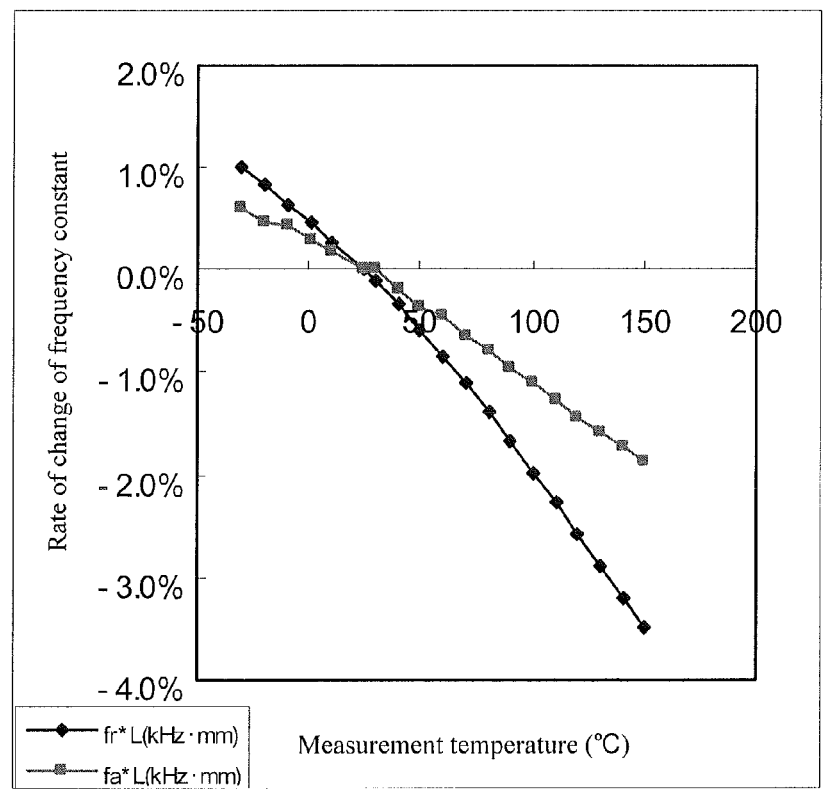
FIG. 3 is a graph showing temperature-dependent variations of resonance and anti-resonance frequencies of the sample 1.

In the Tables 1 and 2, the sample numbers note with '*' are not included in the present invention. Referring to the Table 1, in the samples satisfying all of the conditions, $0 < a \leq 0.12$, $0 < b \leq 0.10$, $0 \leq x \leq 0.18$, $0.8 < y < 1.00$, the second phase transformation was not observed in the temperature-dependent variations of the resonance and anti-resonance frequencies and the piezoelectric $g_{33}$ constant. The sample numbers 1 to 7, 10 to 16, 20 and 23, in particular, wherein the electromechanical coupling factor $k_{33}$ is 30% or more, the piezoelectric $g_{33}$ constant is $20 \times 10^{-3}$ V/N or more, and the second phase transformation is controlled in the temperature range of −40 to 150° C., show the favorable properties. For example, FIG. 2 is a graph showing the temperature-dependent variation of the piezoelectric $g_{33}$ constant of the sample 1, FIG. 3 is a graph showing the temperature-dependent variations of the resonance and anti-resonance frequencies of the sample 1, FIG. 4 is a graph showing the temperature-dependent variation of the piezoelectric $g_{33}$ constant of the sample 3, and FIG. 5 is a graph showing the temperature-dependent variations of the resonance and anti-resonance frequencies of the sample 3. In particular, the samples (compositions) in the range expressed by $0.02 \leq a \leq 0.04$, $0.01 < b \leq 0.03$, $0.025 \leq x \leq 0.075$, $0.905 < y < 0.98$ has such high Curie temperatures as 280° C. or more.

Referring to all of the sample numbers provided with * which are not included in the range according to the present invention, the second phase transformation exists in the temperature range of −40 to 150° C. For example, in the sample satisfying a=0 and failing to satisfy $0 < a \leq 0.12$ though $0 < b \leq 0.10$, $0 \leq x \leq 0.18$, $0.8 < y < 1.00$ is satisfied, as in the sample number 18, the electromechanical coupling factor $k_{33}$ is 30% or more and the piezoelectric $g_{33}$ constant is $20 \times 10^{-3}$ V/N or more, however, the large second phase transformation is included in the temperature range of −40 to 150° C. as shown in FIGS. 6 and 7. In the case where 'a' satisfies the range of $0 < a \leq 0.12$ based on the sample 18, the electromechanical coupling factor $k_{33}$ is 30% or more and the piezoelectric $g_{33}$ constant is $20 \times 10^{-3}$ V/N or more in, for example, the samples 1 and 3. Therefore, an object of the invention can be achieved without the inclusion of the second phase transformation in the temperature range of −40 to 150° C. as shown in FIGS. 2, 3, 4 and 5.

Figure 8:
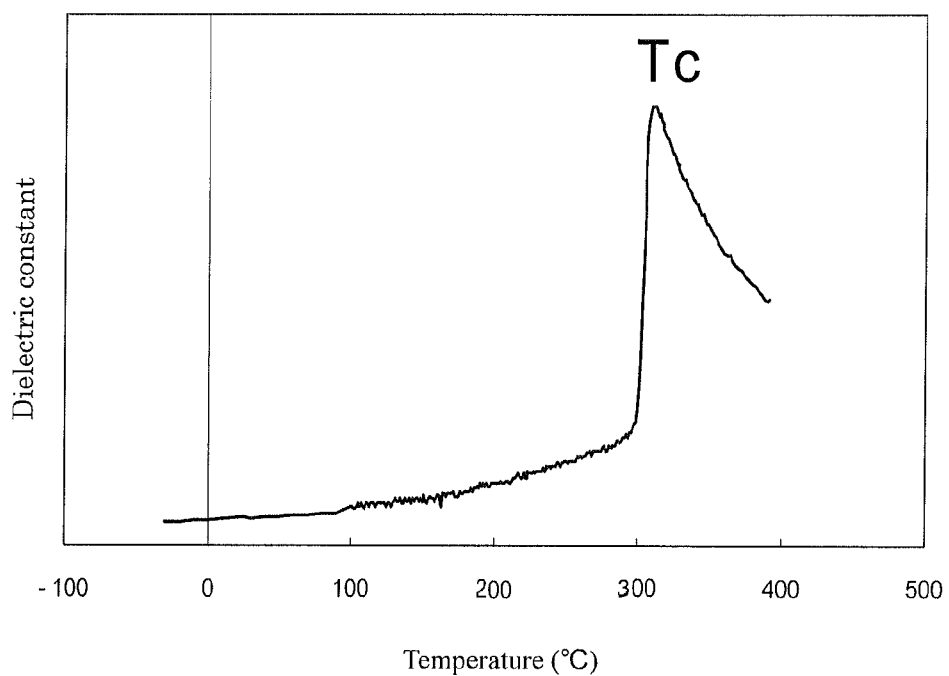
FIG. 8 is a graph showing a measurement result of a temperature-dependent variation of a relative dielectric constant of the sample 1.

FIG. 8 shows the measurement result of the temperature-dependent variation of the relative dielectric constant of the sample 1. As described above, it was confirmed in FIGS. 2 and 3 that the second phase transformation did not exist in the temperature range of −40 to 150° C., for example, in the sample 1. As a result of the examination of the temperature dependency of the relative dielectric constant in the behavior up to the Curie temperature over the range, no discontinuous behavior of the relative dielectric constant resulting from the second phase transformation was observed. Therefore, in the case of the sample 1, it was confirmed that the second phase transformation was not included in the range of −40° C. through the Curie temperature (300° C.). For example, the sample 1 having the high Curie temperature can be subjected to the SMD reflow mounting process, and can replace the conventional piezoelectric element including lead as the piezoelectric element not including lead.

The piezoelectric ceramic composition and the piezoelectric ceramic according to the present invention were described thus far in detail. The scope of the present invention is not necessarily limited to the description given so far, and can be variously modified and improved within such a range that does not impair the intention of the present invention.

The invention claimed is:
1. A piezoelectric ceramic having the formula (1-a-b) $(K_x Na_y Li_{1-x-y})NbO_3$-$a(Bi_{0.5}Na_{0.5})TiO_3$-$bBiFeO_3$, wherein:
 $0 < a \leq 0.12$
 $0 < b \leq 0.10$
 $0 \leq x \leq 0.18$
 $0.8 < y < 1.00$.

2. The piezoelectric ceramic composition according to claim 1, wherein $0.02 \leq a \leq 0.04$ $0.01 < b \leq 0.03$ $0.025 \leq x \leq 0.075$ $0.905 < y < 0.98$.

3. The piezoelectric ceramic according to claim 1, wherein a second phase transformation does not exist in the temperature range of −40 to 150° C. in at least one of a temperature-dependent variation of a resonance frequency, a temperature-dependent variation of an anti-resonance frequency and a temperature-dependent variation of piezoelectric $g_{33}$ constant.

4. The piezoelectric ceramic according to claim 1, that has an electromechanical coupling factor $k_{33}$ of 30% or more, and a piezoelectric $g_{33}$ constant of $20 \times 10^{-3}$ V/N or more.

5. The piezoelectric ceramic according to claim 1, wherein that has a perovskite type crystalline structure.

6. The piezoelectric ceramic according to claim 2, that has a Curie temperature higher than 280° C.

7. A piezoelectric ceramic having the formula $(1-a-b)(K_x Na_y Li_{1-x-y})NbO_3$-a $(Bi_{0.5}Na_{0.5})TiO_3$-$bBiFeO_3$, wherein $0 < a \leq 0.12$ $0 < b \leq 0.10$ $0 \leq x \leq 0.19$ $0.79 \leq x \leq 1.00$.

* * * * *